(12) United States Patent
Nappi et al.

(10) Patent No.: US 9,412,467 B2
(45) Date of Patent: Aug. 9, 2016

(54) SEMICONDUCTOR DEVICE HAVING A TEST CONTROLLER AND METHOD OF OPERATION

(71) Applicants: Chris P. Nappi, Austin, TX (US); Stephen F. McGinty, Gartcosh (GB)

(72) Inventors: Chris P. Nappi, Austin, TX (US); Stephen F. McGinty, Gartcosh (GB)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 108 days.

(21) Appl. No.: 14/264,473

(22) Filed: Apr. 29, 2014

(65) Prior Publication Data
US 2015/0310932 A1 Oct. 29, 2015

(51) Int. Cl.
*G11C 29/38* (2006.01)
*G11C 29/02* (2006.01)
*G11C 29/16* (2006.01)

(52) U.S. Cl.
CPC ............ *G11C 29/021* (2013.01); *G11C 29/023* (2013.01); *G11C 29/026* (2013.01); *G11C 29/16* (2013.01)

(58) Field of Classification Search
CPC .............. G06F 11/2242; G06F 11/267; G01R 31/318547; G01R 31/31908; G01R 31/28; G01R 31/30; G01R 31/3163; G01R 31/318836; G01R 31/318575; G01R 31/318577
See application file for complete search history.

(56) References Cited

U.S. PATENT DOCUMENTS

| | | | |
|---|---|---|---|
| 6,154,860 A * | 11/2000 | Wright | G11C 29/38 365/201 |
| 6,378,090 B1 | 4/2002 | Bhattacharya | |
| 6,550,026 B1 * | 4/2003 | Wright | G11C 29/38 365/189.04 |
| 8,195,993 B2 * | 6/2012 | Okukawa | G01R 31/3183 714/718 |
| 8,694,840 B2 * | 4/2014 | Burggraf, III | G11C 29/16 714/718 |
| 9,043,665 B2 * | 5/2015 | Patil | G01R 31/318508 714/734 |
| 2007/0250740 A1 | 10/2007 | Jayabharathi | |
| 2008/0016421 A1 | 1/2008 | McDevitt | |
| 2008/0115026 A1 | 5/2008 | Dieffenderfer et al. | |
| 2013/0148431 A1 * | 6/2013 | Burggraf, III | G11C 29/00 365/185.18 |
| 2013/0268808 A1 * | 10/2013 | Patil | G06F 11/2242 714/32 |

* cited by examiner

*Primary Examiner* — Nadeem Iqbal

(57) ABSTRACT

A semiconductor device includes a test port configured to communicate with a test system, a test command controller coupled to communicate with the test port, a peripheral module configured to communicate with the test command controller, a processor, and a test memory configured to communicate with the test command controller and the processor. The test command controller is configured to issue a first set of one or more instructions to test the peripheral module and to issue a second set of one or more instructions to the processor to process information in the test memory resulting from the test of the peripheral module.

20 Claims, 2 Drawing Sheets

SEMICONDUCTOR DEVICE HAVING A TEST CONTROLLER AND METHOD OF OPERATION

BACKGROUND

1. Field

This disclosure relates generally to integrated circuits, and more specifically, to semiconductor device having a test controller.

2. Related Art

Register-based testing of system-on-a-chip (SoC) allows for register-configured testing which may include, for example, the use of self tests to test and trim analog circuits. Currently, register-based testing may be performed using either a slave test port or a master mode test. With a slave test port, the SoC includes a slave test port in which an external tester is the master and has access to read and write registers of peripherals of the SoC, in which these accesses by the external tester are synchronous with the SoC. For example, the slave test port may provide access to the system bus of the SoC. However, in the case of a slave test port, the test data has to be serially transferred to the external tester for any determination to be made on the test data, such the pass/fail status or best trim values. This increases test time. With a master mode test, the processor of the SoC executes code from a random access memory (RAM) of the SoC. The code allows for the processor to perform processor functions but is not synchronized to an external tester. This requires the external tester to be more aware of the SoC testing and also reduces testing visibility. Therefore, a need exists for improved SoC testing.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In an SoC, a test controller monitors a test port which is configured to receive commands from an external tester. In response to a command, the test controller generates one or more processor instructions and provides them to a processor of the SoC. The processor executes the processor instructions, accessing test RAM and peripherals of the SoC as needed. The test commands provided to the test port may include commands such as, for example, read/write register commands, copy commands, trim commands, and math commands. The test port operates synchronously with the external tester. The test controller, in performing the test commands, is capable of leveraging portions of the SoC, such as the processor. This may allow, for example, for the test controller to perform on-chip calculations for trims and analog limits.

Figure 1:
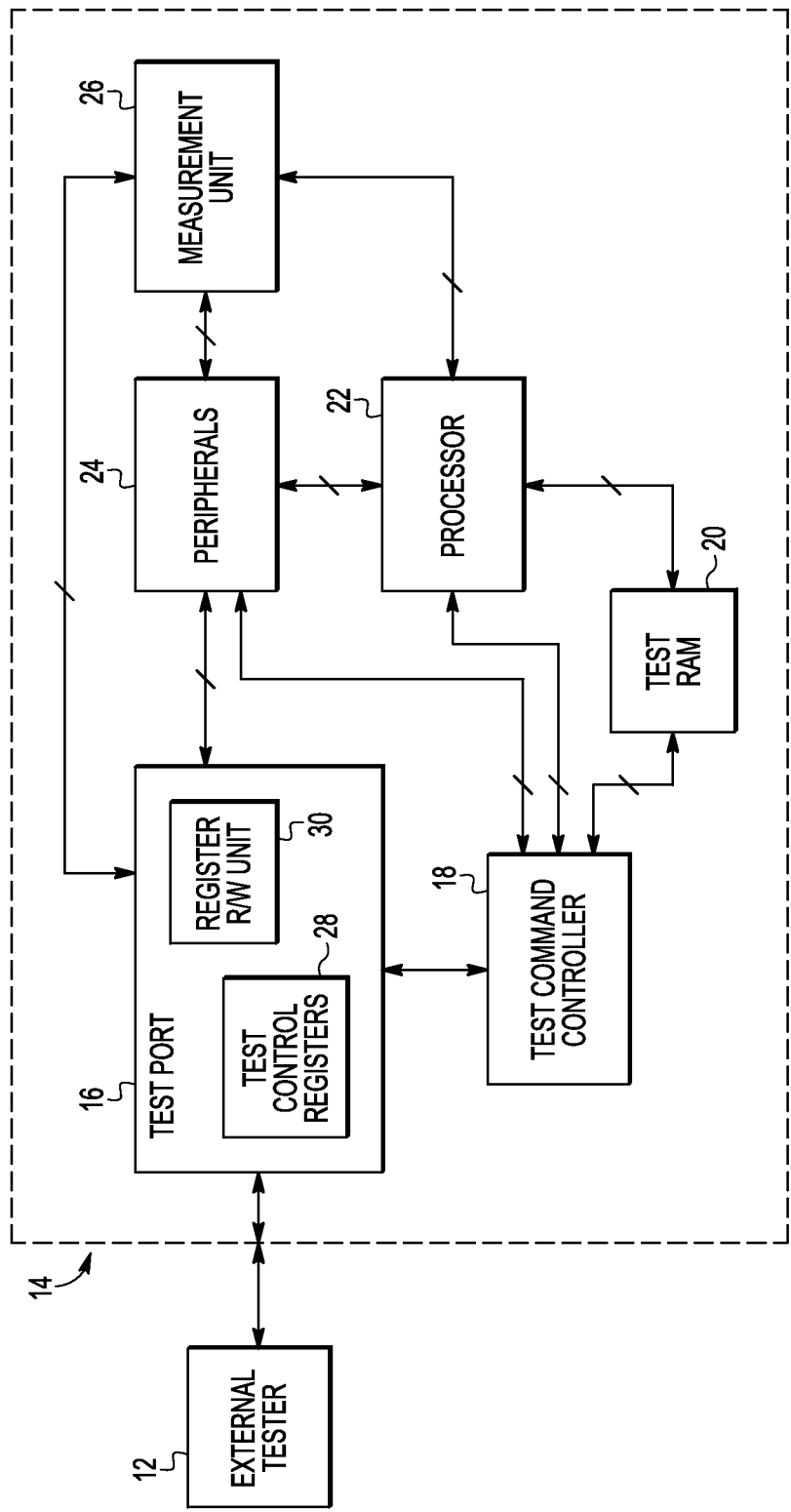
FIG. 1 illustrates a system in accordance with an embodiment of the present invention.

FIG. 1 illustrates a system 10 in accordance with one embodiment of the present invention. System 10 includes an SoC 14 and an external tester 12 coupled to SoC 14. SoC 14 includes a test port 16, peripherals 24, a measurement unit 26, a processor 22, a test command controller 18, and a test random access memory (RAM) 20. Test portion 16 includes a register read/write (R/W) unit 30 and test control registers 28, and is bidirectionally coupled to test command controller 18 and peripherals 24. Test command controller 18 is bidirectionally coupled to peripherals 24, processor 22, test RAM 20, and measurement unit 26. Processor 22 is bidirectionally coupled to peripherals 24, test RAM 20, and measurement unit 26. Measurement unit 26 is bidirectionally coupled to peripherals 24. Alternatively, test RAM 20 may be any type of test memory. For example, it may be a bank of registers. Note that only a portion of SoC 14 is illustrated and may include other modules. For example, although not illustrated, SoC 14 may include one or more additional processors. In one embodiment, processor 22 operates as a test processor which only operates during test mode. In alternate embodiments, any processor of SoC 14 may also operate as the test processor. Peripherals 24 may include any type of module and includes one or more testable (e.g. measureable) voltage nodes, one or more testable (e.g. measureable) frequency nodes, and/or one or more testable (e.g. measureable) current nodes. Peripherals 24 may include one or more of a non-volatile memory (NVM), an on-chip clock source, a band-gap reference voltage generator, a voltage divider, a charge pump, a sense amplifier, or a digital to analog converter.

After manufacture of SoC 14, register-configured testing may be performed on SoC 14 in order, for example, to test and trim analog circuits of SoC 14. For example, these analog circuits may be included within peripherals 24. Measurement unit 16 may include circuitry which measures values at more or more testable (e.g. measureable) nodes of circuitry within peripherals 24, such as, for example, voltages, frequencies, or currents of testable nodes within peripherals 24. These measureable values may also be referred to as test parameters. For example, peripherals 24 may include a non-volatile memory (NVM) having a charge pump to provide a voltage to the NVM. Measurement unit 26 may be used to measure the output voltage provided by the charge pump.

In one embodiment, measurement unit 26 operates under the direction of processor 22. That is, processor 22 may provide command to measurement unit 26 to direct measurement unit 26 to make measurements at various circuit nodes (i.e. test points) within circuitry of peripherals 24. External tester 12 provides commands to test port 16 to perform testing of SoC 14. The commands provided by external tester 12 are stored within test control registers 28 and may include arguments or parameters associated with the commands. Test command controller 18 monitors test control register 28 and, in response to detecting a command received by test port 16 and stored within test control registers 28, interprets the command and generates processor instructions which are provided to processor 22. That is, test command controller 18 may translate each test command to one or more processor instructions for execution by processor 22. These processor instructions may include instructions, which, when executed by processor 22, allow processor 22 to direct measurement unit 26 to make a measurement at a particular test point within peripherals 24, to store measured values from measurement unit 26 to test RAM 20, to perform calculations on values stored within test RAM 20, or to use any other resources available within SoC 14 that are needed for implementing a test command detected by test command controller 18. The processor instructions may also include instructions, which, when executed by processor 22, allow processor 22 to direct or instruct a peripheral within peripherals 24 to output a test parameter, such as voltage, current, or frequency, at a test point as needed to implement a test command. In this case, processor 22 may format instructions received from test controller 18 to a specified bus protocol of processor 22 to generate a bus transaction, and then send the bus transaction to the peripheral. Alternatively, other processor instructions may be provided to processor 22 by test command controller 18 as needed to implement a test command.

Example test commands which may be provided by external tester 12 to test port 16 includes a read/write command, a copy command, a math command, a trim command, and a search command. In one embodiment, a read/write command allows test command controller to read/write registers within peripherals 24. For example, a value can be written to a register within peripherals 24 to configure a peripheral as needed for a particular test. These values can be provided with the test command by external tester 12 to test port 16 and may be stored with the test command in test control registers 28. Similarly, a value can be read from a register within peripherals 24. Therefore, a read/write command allows access to the peripheral bus (which may be located within peripherals 24 and provides communication with the peripherals within peripherals 24). In one embodiment, a copy command can be used to copy data from the peripheral bus into test RAM 20. For example, data from a register within peripherals 24 can be written to test RAM 20. In one embodiment, a math command provides match functions which may operate on values stored within test RAM 20. For example, these math functions may include a function to compare two numbers stored within test RAM 20, to compare a number stored within test RAM 20 to a value provided by external tester 12 with the test command, and functions to perform other mathematical functions, such as add, subtract, equals, greater than, or less than. The math functions may, for example, include any function that is capable of being implemented by processor 22. The desired function can be indicated by external tester 12 as part of the math command. In one embodiment, a trim command returns the value closes to a given target from an on-chip collection of data values. For example, a target value may be provided with the trim command by external tester 12 to test port 16. Test commander 18 can provide this value to processor 22 which may determine which value stored within test RAM 20 is closes to the target value. This value can be provided to test commander 18 and provided back to external tester 12 by test port 16. In one embodiment, a trim/search command allows processor 22 to perform a binary search on values measured from a test node and determine the trim value that is closest to a specified measurement value.

Therefore, test command controller 18, in response to a test command, is configured to issue one or more instructions to test circuitry within peripherals 24. Note that various different circuitry within peripherals 24 may be tested. Also, test command controller 18, in response to a test command, is configured to issue one or more instructions to process information stored in test RAM 20 which resulted from testing the circuitry within peripherals 24.

In one embodiment, test port 16 may directly read and/or write registers within peripherals 24 and/or measurement unit 26. For example, register read/write unit 30 may directly perform read/writes to/from registers in peripherals 24 and/or measurement unit 26 based on information received and stored into test control registers 28. For example, test port 16, may directly write to registers within measurement unit 26 to direct measurement unit 26 to make a measurement at a particular test point within peripherals 24.

In one embodiment, the test commands are independent of the processor architecture of processor 22. A test command controller, such as test command controller 18, can be designed, as needed, to interpret test commands and translate them to appropriate processor instructions in accordance with the architecture of the processor, such as processor 22. In this manner, a same set of test commands and interface can be used across SoCs. Furthermore, in an alternate embodiment, note that test command controller 18 and processor 22 can be implemented as a state machine which provides appropriate instructions to processor 22 and/or peripherals 24, in response to the test commands.

Figure 2:
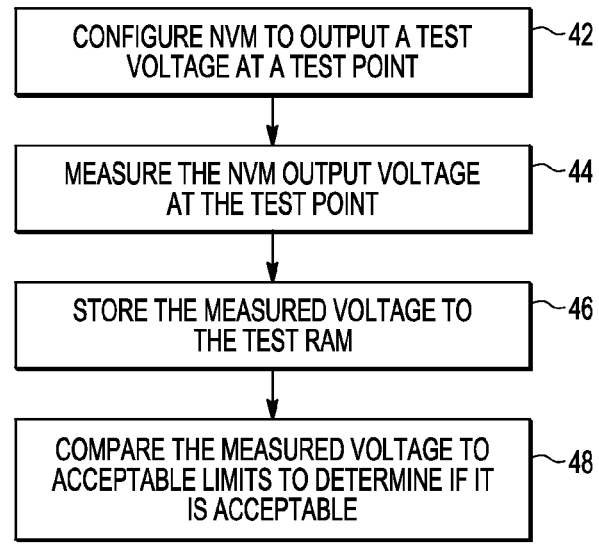
FIGS. 2-4 illustrate a methods of operating the system of FIG. 1 in accordance with an embodiment of the present invention.
Figures 3, 4:
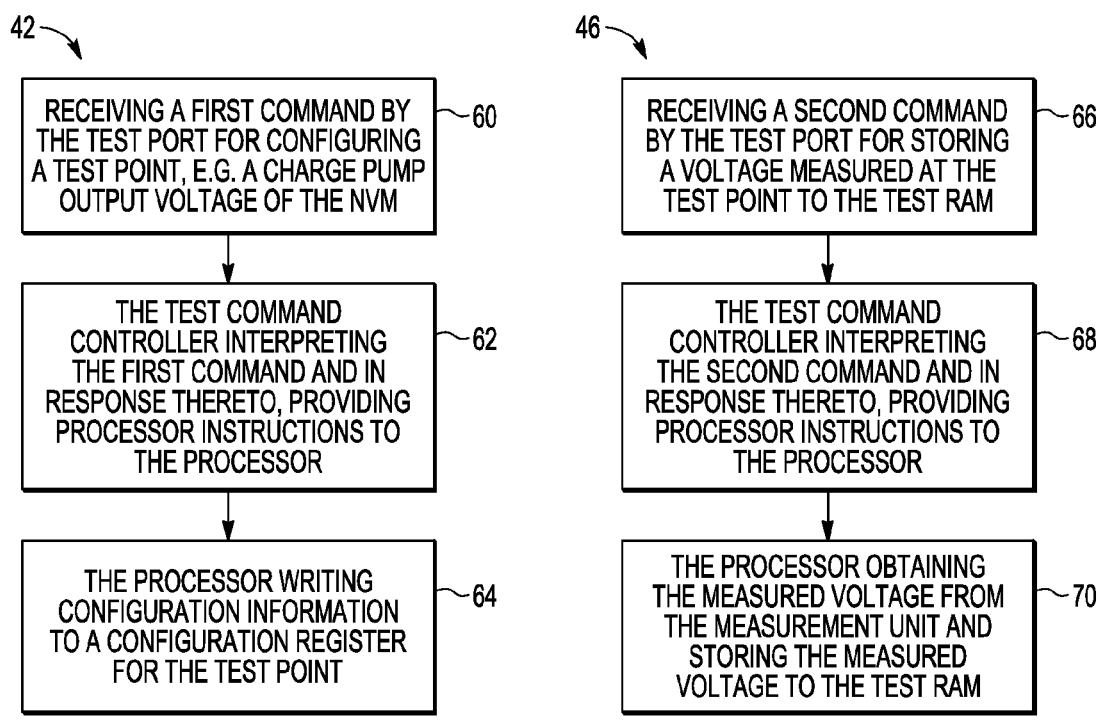

FIG. 2 illustrates a method 40 of operating system 10 of FIG. 1 in accordance with one embodiment of the present invention. Method 40 begins with block 42 in which an NVM, which may be one of peripherals 24, is configured to output a test voltage at a test point. For example, FIG. 3 illustrates block 42 in further detail in accordance with one embodiment of the present invention. First, in block 60, test port 16 may receive a first test command from external tester 12 for configuring a test point, such as a charge pump output voltage of the NVM. Next, in block 62, test command controller 18, in response to the first test command, interprets the first test command and provides processor instruction to processor 22. These instructions, when executed by processor 22, writes configuration information to a configuration register for the particular test point, as illustrated in block 64. The writing of the configuration information to the configuration registers within the NVM or control circuitry which controls the NVM results in the NVM outputting the test voltage. The values to be written to the configuration register may be provided with the first test command from tester 12 and may be stored along with the first test command in test control registers 28. (Note that in an alternate embodiment, in response to the first test command from tester 12, register read/write unit 30 may directly write to the one or more configuration registers to result in the NVM outputting the test voltage.)

Referring back to FIG. 2, method 40 proceeds to block 44 in which the NVM output voltage at the test point is measured. For example, tester 12 may provide a test command to test port 16, and in response to that command, test command controller 18 may provide processor instructions to processor 22 which, when executed by processor 22, causes measurement unit 26 to measure the output voltage at the test point.

Method 40 proceeds to block 46 in which the measured voltage is stored to test RAM 20. For example, FIG. 4 illustrates block 46 in further detail in accordance with one embodiment of the present invention. First, in block 66, test port 16 may receive a second test command from external tester 12 for storing a voltage measured at the test point to test RAM 20. Next, in block 68, test command controller 18, in response to the second test command, interprets the second test command provides processor instruction to processor 22. These instructions, when executed by processor 22, obtains the measured voltage from measurement unit 26 and stores the measured voltage to rest RAM 20, as illustrated in block 70.

Referring back to FIG. 2, method 40 then proceeds to block 48 in which the measured voltage is compared to acceptable limits to determine if it is acceptable. For example, tester 12 may provide a test command to test port 16, and in response to that command, test command controller 18 may provide processor instructions to processor 22 which, when executed by processor 22, results in the comparison. Note that the acceptable limits may be limits stored within SoC 14, such as within test RAM 20 or elsewhere within SoC 14, or may be provided as part of the test command from tester 12. In the latter case, the acceptable limits may be stored in test control registers 28 along with the test command. The instructions executed by processor 22 may use comparators available to processor 22 to perform the comparisons. Processor 22 may also provide the result of the comparison back to test command controller 18, and the result may then be communicated back to external tester 12 by way of test port 16.

Therefore, in this manner, it can be seen how test commands provided by tester 12 to test port 16 may be interpreted by test command controller 18 and translated into processor instructions provided to processor 22. Processor 22 may therefore implement the necessary functions to perform the test commands.

By now it should be understood how a test command controller may receive test commands from an external tester and generate one or more processor instructions for execution by a processor of the SoC. In this manner, external tester may perform various test operations on SoC 14 such as, for example, performing read and write of registers with SoC 14, performing trim and search operations, perform mathematical functions and other operations on test data within the test RAM, etc. Note that the external tester provides test commands to the test command controller and is capable of receiving results from the test command controller in response to the test commands. The test port and test command controller therefore operate synchronously with the external tester. Furthermore, by translating test commands to processor instructions, test command controller 18 is capable of leveraging portions of the SoC, as needed, to perform the test commands.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, test command controller and processor 22 may be implemented together as a state machine which can leverage portions of SoC 14 to perform the test commands. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a semiconductor device includes a test port configured to communicate with a test system; a test command controller coupled to communicate with the test port; a peripheral module configured to communicate with the test command controller; a processor; a test memory configured to communicate with the test command controller and the processor; wherein the test command controller is configured to issue a first set of one or more instructions to test the peripheral module and to issue a second set of one or more instructions to the processor to process information in the test memory resulting from the test of the peripheral module. In one aspect of the above embodiment, the test port further includes a set of test control registers to store test commands from the test system, wherein the test command controller translates the test commands to the first and second sets of one or more instructions. In another aspect, the test port further includes a register read/write unit configured to directly access the peripheral module. In another aspect, the test port further includes a measurement unit coupled to communicate with the peripheral module and the processor, wherein the measurement unit is operable to provide measurements of at least one of frequencies and voltages on the semiconductor device. In another aspect, the test memory is one of a group consisting of a random access memory (RAM) and a bank of registers. In a further aspect, the test commands are independent of the processor and include at least one of a group consisting of: a read command to read information from the peripheral module; a write command to write information to the peripheral module; a copy command to copy information from the peripheral module to the test memory; a math function, wherein the math function is performed by the processor using the information in the test memory; a trim command that returns a trim value closest to a specified measurement value from a set of trim values; and a search command to determine the trim value closest to the specified measurement. In another aspect, the peripheral module is one of a group consisting of: a module on the semiconductor device that has a measurable voltage or frequency node, a non-volatile memory, an on-chip clock source, a band-gap reference voltage generator, a voltage divider, a charge pump, a sense amplifier, and a digital to analog converter.

In another embodiment, a method of testing a semiconductor device includes receiving via a test port a test command from a test system external to the semiconductor device; providing instructions based on the test command to a peripheral module on the semiconductor device to output a test parameter at a test point; measuring the test parameter using a measurement unit on the semiconductor device; storing the measured test parameter in a test memory on the semiconductor device; comparing the measured test parameter to a predetermined value, wherein the comparing is performed by a processor on the semiconductor device. In one aspect of the another embodiment, the method further includes providing a result of the comparing the measured test parameter to the predetermined value to the external test system via the test port. In another aspect, the providing the instructions based on the test command to the peripheral module includes interpreting the test command in a test controller on the semiconductor device to generate the instructions based on the test command: providing the instructions from the test controller to the peripheral module. In another aspect, the providing the instructions based on the test command to the peripheral module includes interpreting the test command in a test controller on the semiconductor device to generate the instructions based on the test command; providing the instructions from the test controller to the processor on the semiconductor device; formatting the instructions according to a specified bus protocol in the processor to generate a bus transaction; and sending the bus transaction from the processor to the peripheral module. In a further aspect, the method further includes receiving the measured test parameter from a measurement unit in the processor; the storing the measured test parameter in the test memory is performed by the processor. In another aspect of the another embodiment, the method further includes receiving via the test port a second test command from the test system; interpreting the second command in a test command controller to generate a second set of instructions; providing the second set of instructions to a processor, wherein the second set of instructions include the measuring the test parameter, obtaining the measured test parameter, and the storing the measured test parameter in the test memory. In another further aspect, the method further includes reading information from the peripheral module in response to the test command being a read command; writing information to the peripheral module in response to the test command being a write command; copying information from the peripheral module to the test memory in response to the test command being a copy command; returning a trim value closest to a specified measurement value from a set of trim values in response to the test command being at least one trim command; performing a math operation in the processor in response to the test command being a math command. In another further aspect, the peripheral module is one of a group consisting of: a non-volatile memory, an on-chip clock source, a band-gap reference voltage generator, a voltage divider, a charge pump, a sense amplifier, and a digital to analog converter.

In another embodiment, a semiconductor device includes a test port configured to receive test commands from a test system external to the semiconductor device; a test command controller coupled to the test port to receive the test commands, the test command controller is configured to interpret the test commands, translate the test commands to one or more instructions, and provide the instructions to at least one of a peripheral module and a processor, the peripheral module and the processor are on the semiconductor device; the peripheral module performs the one or more instructions; the processor is configured to process test data resulting from performing the one or more instructions. In one aspect of the above embodiment, the test command controller provides the instructions to the processor and the processor provides the instructions to the peripheral module. In another aspect, the semiconductor device further includes a measurement unit coupled to measure test data from the peripheral module. In another aspect, the semiconductor device further includes a test memory coupled to the processor and the test command controller, the test memory is configured to store the test data and the processed test data. In yet a further aspect, the test command is at least one of a group consisting of: a command to copy the test data from the measurement unit to the test memory, a command to read information from the peripheral module, a command to write information to the peripheral module, a command to return a trim value closest to a specified measurement value from a set of trim values, and a command to perform a math operation in the processor.

What is claimed is:
1. A semiconductor device, comprising:
 a test port configured to communicate with a test system;
 a test command controller coupled to communicate with the test port;

a peripheral module configured to communicate with the test command controller;

a processor;

a test memory configured to communicate with the test command controller and the processor;

wherein the test command controller is configured to issue a first set of one or more instructions to test the peripheral module and to issue a second set of one or more instructions to the processor to process information in the test memory resulting from the test of the peripheral module.

2. The device of claim 1, the test port further comprising:

a set of test control registers to store test commands from the test system, wherein the test command controller translates the test commands to the first and second sets of one or more instructions.

3. The device of claim 1, the test port further comprising:

a register read/write unit configured to directly access the peripheral module.

4. The device of claim 1, further comprising:

a measurement unit coupled to communicate with the peripheral module and the processor, wherein the measurement unit is operable to provide measurements of at least one of frequencies and voltages on the semiconductor device.

5. The device of claim 1, wherein:

the test memory is one of a group consisting of a random access memory (RAM) and a bank of registers.

6. The device of claim 2, wherein the test commands are independent of the processor and include at least one of a group consisting of:

a read command to read information from the peripheral module;

a write command to write information to the peripheral module;

a copy command to copy information from the peripheral module to the test memory;

a math function, wherein the math function is performed by the processor using the information in the test memory;

a trim command that returns a trim value closest to a specified measurement value from a set of trim values; and a search command to determine the trim value closest to the specified measurement.

7. The device of claim 1, wherein the peripheral module is one of a group consisting of: a module on the semiconductor device that has a measurable voltage or frequency node, a non-volatile memory, an on-chip clock source, a band-gap reference voltage generator, a voltage divider, a charge pump, a sense amplifier, and a digital to analog converter.

8. A method of testing a semiconductor device comprising:

receiving via a test port a test command from a test system external to the semiconductor device;

providing instructions based on the test command to a peripheral module on the semiconductor device to output a test parameter at a test point;

measuring the test parameter using a measurement unit on the semiconductor device;

storing the measured test parameter in a test memory on the semiconductor device;

comparing the measured test parameter to a predetermined value, wherein the comparing is performed by a processor on the semiconductor device.

9. The method of claim 8, further comprising:

providing a result of the comparing the measured test parameter to the predetermined value to the external test system via the test port.

10. The method of claim 8, wherein the providing the instructions based on the test command to the peripheral module comprises:

interpreting the test command in a test controller on the semiconductor device to generate the instructions based on the test command:

providing the instructions from the test controller to the peripheral module.

11. The method of claim 8, wherein the providing the instructions based on the test command to the peripheral module comprises:

interpreting the test command in a test controller on the semiconductor device to generate the instructions based on the test command;

providing the instructions from the test controller to the processor on the semiconductor device;

formatting the instructions according to a specified bus protocol in the processor to generate a bus transaction; and sending the bus transaction from the processor to the peripheral module.

12. The method of claim 11, further comprising:

receiving the measured test parameter from a measurement unit in the processor;

the storing the measured test parameter in the test memory is performed by the processor.

13. The method of claim 8, further comprising:

receiving via the test port a second test command from the test system;

interpreting the second command in a test command controller to generate a second set of instructions;

providing the second set of instructions to a processor, wherein the second set of instructions include the measuring the test parameter, obtaining the measured test parameter, and the storing the measured test parameter in the test memory.

14. The method of claim 11, further comprising:

reading information from the peripheral module in response to the test command being a read command;

writing information to the peripheral module in response to the test command being a write command;

copying information from the peripheral module to the test memory in response to the test command being a copy command;

returning a trim value closest to a specified measurement value from a set of trim values in response to the test command being at least one trim command;

performing a math operation in the processor in response to the test command being a math command.

15. The method of claim 13, wherein the peripheral module is one of a group consisting of: a non-volatile memory, an on-chip clock source, a band-gap reference voltage generator, a voltage divider, a charge pump, a sense amplifier, and a digital to analog converter.

16. A semiconductor device comprising:

a test port configured to receive test commands from a test system external to the semiconductor device;

a test command controller coupled to the test port to receive the test commands, the test command controller is configured to interpret the test commands, translate the test commands to one or more instructions, and provide the instructions to at least one of a peripheral module and a processor, the peripheral module and the processor are on the semiconductor device;

the peripheral module performs the one or more instructions;

the processor is configured to process test data resulting from performing the one or more instructions.

17. The device of claim 16, wherein the test command controller provides the instructions to the processor and the processor provides the instructions to the peripheral module.

18. The device of claim 17, further comprising:
a measurement unit coupled to measure test data from the peripheral module.

19. The device of claim 18, further comprising:
a test memory coupled to the processor and the test command controller, the test memory is configured to store the test data and the processed test data.

20. The device of claim 19, wherein
the test command is at least one of a group consisting of:
a command to copy the test data from the measurement unit to the test memory,
a command to read information from the peripheral module,
a command to write information to the peripheral module,
a command to return a trim value closest to a specified measurement value from a set of trim values, and
a command to perform a math operation in the processor.

* * * * *